United States Patent
Chung et al.

(10) Patent No.: US 9,082,611 B2
(45) Date of Patent: Jul. 14, 2015

(54) METHODS OF FORMING A LAYER

(71) Applicants: Sukjin Chung, Hwaseong-si (KR); JongCheol Lee, Seoul (KR); Younsoo Kim, Yongin-si (KR); Chayoung Yoo, Suwon-si (KR); Geunkyu Choi, Hwaseong-si (KR)

(72) Inventors: Sukjin Chung, Hwaseong-si (KR); JongCheol Lee, Seoul (KR); Younsoo Kim, Yongin-si (KR); Chayoung Yoo, Suwon-si (KR); Geunkyu Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/189,367

(22) Filed: Feb. 25, 2014

(65) Prior Publication Data

US 2014/0287592 A1    Sep. 25, 2014

(30) Foreign Application Priority Data

Mar. 13, 2013 (KR) ........................ 10-2013-0026877

(51) Int. Cl.
*H01L 21/02* (2006.01)

(52) U.S. Cl.
CPC ........ *H01L 21/02219* (2013.01); *H01L 21/022* (2013.01); *H01L 21/0228* (2013.01)

(58) Field of Classification Search
USPC ........................................................ 438/763
See application file for complete search history.

(56) References Cited

U.S. PATENT DOCUMENTS

| | | |
|---|---|---|
| 6,869,638 B2 | 3/2005 | Baum et al. |
| 7,005,392 B2 | 2/2006 | Baum et al. |
| 7,084,080 B2 | 8/2006 | Borovik et al. |
| 7,651,729 B2 | 1/2010 | Kim et al. |
| 7,795,160 B2 | 9/2010 | Wang et al. |
| 2002/0175393 A1 | 11/2002 | Baum et al. |
| 2002/0180028 A1 | 12/2002 | Borovik et al. |
| 2002/0187644 A1 | 12/2002 | Baum et al. |
| 2005/0255246 A1 | 11/2005 | Kim et al. |
| 2006/0228888 A1 | 10/2006 | Lee et al. |
| 2008/0020593 A1 | 1/2008 | Wang et al. |
| 2009/0130414 A1 | 5/2009 | Kim et al. |
| 2011/0207337 A1* | 8/2011 | Dussarrat et al. ............. 438/785 |
| 2011/0262642 A1 | 10/2011 | Xiao et al. |
| 2012/0148745 A1 | 6/2012 | Xiao et al. |

FOREIGN PATENT DOCUMENTS

| | | |
|---|---|---|
| KR | 10-0760962 B1 | 9/2007 |
| KR | 10-1149811 B1 | 7/2012 |
| KR | 2012-0078025 A | 7/2012 |

* cited by examiner

*Primary Examiner* — Asok K Sarkar
(74) *Attorney, Agent, or Firm* — Harness, Dickey & Pierce

(57) ABSTRACT

According to example embodiments, a method of forming a layer includes: forming a dielectric layer using a metal precursor expressed by one of $R^3_y M(NR^1R^2)_{x-y}$ and $M(OR^1R^2)$ and using a silicon precursor expressed by $H_zSi(NR^4R^5)_{4-z}$. Each of "$R^1$", "$R^2$", "$R^3$", "$R^4$", and "$R^5$" are hydrogen or hydrocarbon; "$R^3$" is different than "$R^1$" and "$R^2$"; "x" is in the range of 3 to 5; "y" is in the range of 1 to 4; "z" is in the range of 2 to 3; and "M" is a metal. The dielectric layer is a metal silicate layer or a metal nitride layer doped with silicon.

19 Claims, 4 Drawing Sheets

METHODS OF FORMING A LAYER

CROSS-REFERENCE TO RELATED APPLICATION

This U.S. non-provisional patent application claims priority under 35 U.S.C. ±119 to Korean Patent Application No. 10-2013-0026877, filed on Mar. 13, 2013, in the Korean Intellectual Property Office, the disclosure of which is hereby incorporated by reference in its entirety.

BACKGROUND

Example embodiments of inventive concepts relate to methods of forming a layer.

As semiconductor devices have been increasingly integrated, circuits constituting semiconductor devices have been increasingly finer. For example, sizes of transistors or capacitors are being reduced with high integration of dynamic random access memory (DRAM) devices. However, a cell capacitance should be maintained at the same level or more. In order to increase the cell capacitance, a dielectric constant of a dielectric layer of a capacitor may be increased or a thickness of the dielectric layer may be reduced. However, if the thickness of the dielectric layer is reduced, a leakage current characteristic of the capacitor may be deteriorated.

Thus, a dielectric layer capable of limiting (and/or minimizing) a leakage current and providing a capacitance over a certain level may be desired in semiconductor devices. Various research is being conducted for a dielectric layer having the aforementioned characteristics. Additionally, it may be desirable for the atoms constituting the dielectric layer to be uniformly distributed in order to reduce cell dispersion when forming the dielectric layer.

SUMMARY

Example embodiments of inventive concepts relate to methods of forming a layer capable of realizing a dielectric layer having improved characteristics.

According to example embodiments of inventive concepts, a method of forming a layer may include: forming a dielectric layer using a metal precursor expressed by one of $R^3_y M(NR^1R^2)_{x-y}$ and $M(OR^1R^2)$ and a using a silicon precursor expressed by $H_zSi(NR^4R^5)_{4-z}$, wherein each of "$R^1$", "$R^2$", "$R^3$", "$R^4$", and "$R^5$" denotes hydrogen or hydrocarbon, "$R^3$" is different than "$R^1$" and "$R^2$", "x" is in the range of 3 to 5, "y" is in the range of 1 to 4, "z" is in the range of 2 to 3, and "M" is a metal. The dielectric layer may be one of a metal silicate layer and a metal nitride layer doped with silicon.

In example embodiments, "$R^3$" may be an aromatic cyclic compound.

In example embodiments, "$R^3$" may be $R^6(C_5H_5)$, where "$R^6$" is alkyl having a carbon number of 1 to 4.

In example embodiments, "M" may be one element from groups III, IV and V metals including lanthanide.

In example embodiments, "R3" may be cyclopentadienyl, "M" may be zirconium, and "$R^1$" and "$R^2$" may be methyl groups. In this case, the metal precursor may be expressed by the following chemical formula 1:

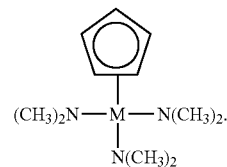

[Chemical formula 1]

In example embodiments, "z" may be 2, and "$R^4$" and "$R^5$" may be ethyl groups, and the silicon precursor may be expressed by the following chemical formula 2:

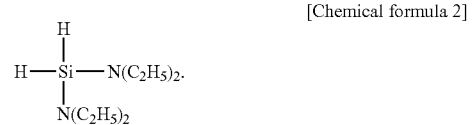

[Chemical formula 2]

In example embodiments, forming the dielectric layer may include: repeating forming a first sub-dielectric layer and forming a second sub-dielectric layer. The forming the first sub-dielectric layer may include forming m atomic layers, each one of the m atomic layers including one of a metal oxide layer and a metal nitride layer. The forming of the second sub-dielectric layer may include forming n atomic layers, each one of the n atomic layers including one of a silicon oxide layer and a silicon nitride layer. Also, m and n may be positive integers.

In example embodiments, the forming n atomic layers may include repeating n times: supplying the silicon precursor to a substrate to adsorb the silicon precursor on a surface of the substrate; and supplying an oxygen-containing gas or a nitrogen-containing gas to react the silicon precursor with the oxygen-containing gas or the nitrogen-containing gas, thereby forming the second sub-dielectric layer. The second sub-dielectric layer may be the silicon oxide layer or the silicon nitride layer.

In example embodiments, the forming the m atomic layers may include repeating m times: supplying the metal precursor to the substrate to adsorb the metal precursor on the surface of the substrate; and supplying an oxygen-containing gas or a nitrogen-containing gas to react the metal precursor with the oxygen-containing gas or the nitrogen-containing gas, thereby forming the second sub-dielectric layer. The second sub-dielectric layer may be the metal oxide layer or the metal nitride layer.

In example embodiments, m and n may be different values.

In example embodiments, the method may further include: performing a thermal treatment. The thermal treatment may diffuse silicon atoms in the second sub-dielectric layer into the first sub-dielectric layer. The thermal treatment may be performed at a temperature of about 500 degrees Celsius (° C.) or more.

In example embodiments, the repeating forming a first sub-dielectric layer and forming a second sub-dielectric layer may form a plurality of first sub-dielectric layers and second sub-dielectric layers alternately stacked on each other. The method may further include: depositing a metal layer on the alternately stacked first and second sub-dielectric layers. The depositing the metal layer may be performed at a temperature of about 500 degrees Celsius (° C.) or more, and silicon atoms included in the second sub-dielectric layer may be diffused into the first sub-dielectric layer during the depositing the metal layer.

In example embodiments, the oxygen-containing gas may include at least one of oxygen ($O_2$), ozone ($O_3$), water vapor ($H_2O$), and nitrous oxide ($N_2O$); and the nitrogen-containing gas may include at least one of nitrogen ($N_2$), ammonia ($NH_3$), and hydrazine ($N_2H_4$).

In example embodiments, forming the dielectric layer may be performed by one of an atomic layer deposition method and an organic metal chemical vapor deposition method.

In example embodiments, the silicon precursor and the metal precursor may respectively have substantially constant deposition rates in a same temperature range.

In example embodiments, the dielectric layer may be used as a gate insulating layer or a capacitor dielectric layer.

According to example embodiments of inventive concepts, a method of forming a layer may include: depositing a metal precursor on a substrate, and depositing a silicon precursor on the substrate. The metal precursor may be expressed by one of $R^3_y M(NR^1R^2)_{x-y}$ and $M(OR^1R^2)$. Each of $R^1$, $R^2$, and $R^3$ may be one of hydrogen and hydrocarbon. $R^3$ may be different than $R^1$ and $R^2$. Also, x may be in the range of 3 to 5, y may be in the range of 1 to 4, and M may be one element from groups II, IV, and V including lanthanide. The silicon precursor may be expressed by $H_zSi(NR^4R^5)_{4-z}$. Each of $R^4$ and $R^5$ may be one of hydrogen and hydrocarbon. Also, z may be in the range of 2 to 3. In example embodiments, the depositing the metal precursor on the substrate and the depositing the silicon precursor on the substrate may be performed in one process chamber at temperatures in similar temperature ranges to each other.

In example embodiments, the method may further include forming a first sub-dielectric layer and forming a second sub-dielectric layer; forming a plurality of first and second sub-dielectric layers alternately stacked by alternately repeating the forming the first sub-dielectric layer and the forming the second sub-dielectric layer, and performing one of a thermal treatment and a conductive layer deposition process on the substrate after the forming the plurality of first and second sub-dielectric layers alternately stacked. The forming the first sub-dielectric layer may include repeating m times: depositing an amount of the metal precursor on the substrate in a process chamber; purging a portion of the metal precursor that is not adsorbed on the substrate to an outside of the chamber; forming one layer of the first sub-dielectric layer by reacting one of a oxygen-containing gas and a nitrogen-containing gas with an adsorbed portion of the metal precursor that is adsorbed on the substrate. The one layer of the first sub-dielectric layer may be one of a metal oxide layer and a metal nitride layer. The forming the second sub-dielectric layer may include repeating n times: supplying an amount of the silicon precursor on the substrate in the process chamber, purging a portion of the silicon precursor that is not adsorbed to the substrate to the outside of the chamber, and forming one layer of the second sub-dielectric layer by reacting one of the nitrogen-containing gas and the oxygen-containing gas with an adsorbed portion of the silicon precursor that is adsorbed on the substrate. The one layer of the second sub-dielectric layer may be one a silicon oxide layer and a silicon nitride layer. Also, m and n may be positive integers.

In example embodiments, the metal precursor and the silicon precursor may be express by the following chemical formulae 1 and 2, respectively:

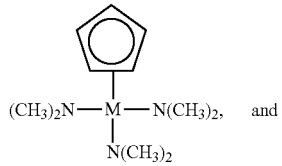

[Chemical formula 1]

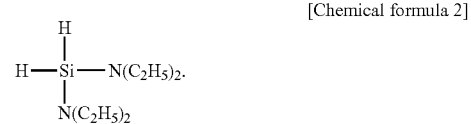

[Chemical formula 2]

BRIEF DESCRIPTION OF THE DRAWINGS

Example embodiments of inventive concepts will become more apparent in view of the attached drawings and accompanying detailed description.

DETAILED DESCRIPTION OF THE EMBODIMENTS

Figure 1:
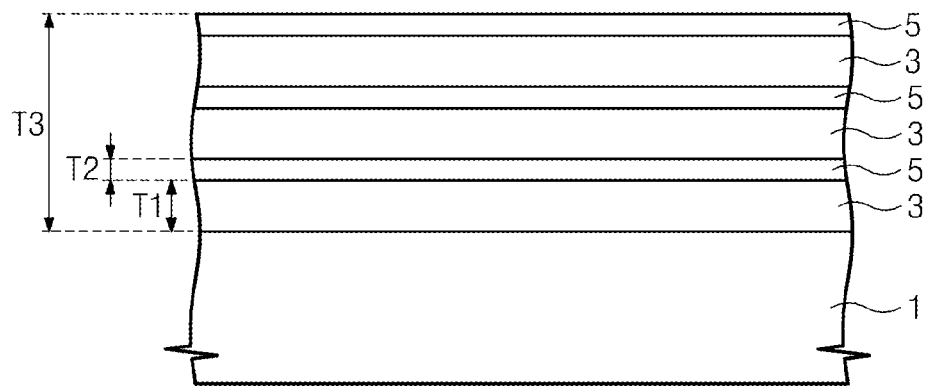
FIGS. 1 and 2 are cross-sectional views illustrating a method of manufacturing a semiconductor device according to example embodiments of inventive concepts.

Example embodiments of inventive concepts will now be described more fully hereinafter with reference to the accompanying drawings, in which some embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

The terminology used herein is for the purpose of describing particular embodiments only and is not intended to limit the scope of the claims. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent." "on" versus "directly on").

It will be further understood that the terms "comprises", "comprising,", "includes" and/or "including", when used herein, specify the presence of stated features. integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

It will be also understood that although the terms first, second, third etc. may be used herein to describe various elements, these elements should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments. Hereinafter, embodiments of the inventive concepts will be described in more detail.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
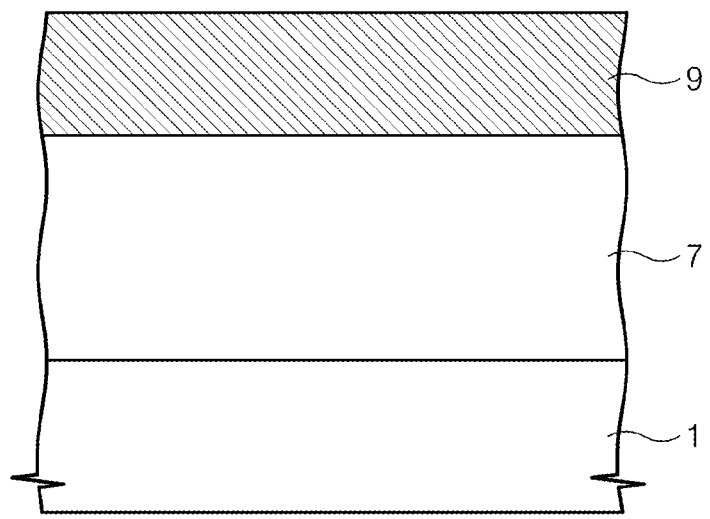

FIGS. 1 and 2 are cross-sectional views illustrating a method of manufacturing a semiconductor device according to example embodiments of inventive concepts.

Referring to FIG. 1, a substrate 1 is prepared. The substrate 1 may include a semiconductor or a semiconductor-on-insulator. For example, the substrate 1 may be a silicon wafer or a silicon-on-insulator (SOI) substrate. A first sub-dielectric layer 3 may be formed on the substrate 1. The first sub-dielectric layer 3 may be a metal oxide layer or a metal nitride layer. A metal included in the first sub-dielectric layer 3 may be one element from groups III, IV and V metals including lanthanide.

In order to form the first sub-dielectric layer 3, the substrate 1 may be loaded into a deposition chamber and a metal precursor may be supplied into the deposition chamber. The metal precursor may be an amide-based material expressed by $R^3{}_y M(NR^1R^2)_{x-y}$, or an alkoxy-based material expressed by $M(OR^1R^2)$. Each of "$R^1$", "$R^2$", and "$R^3$" denotes hydrogen or hydrocarbon. Also, "$R^3$" is different from "$R^1$" and "$R^2$", "x" may be in the range of 3 to 5 inclusive, and "y" may be in the range of 1 to 4 inclusive. "M" may be a metal. For example, "M" may be one element from groups III, IV and V metals including lanthanide. If the metal precursor is the amide based-material, "$R^3$" may be an aromatic cyclic compound. In particular, "$R^3$" may be $R^6(C_5H_5)$ where "$R^6$" may be alkyl having a carbon or hydrogen number of 1 to 4 inclusive.

According to example embodiments of inventive concepts, "$R^3$" may be cyclopentadienyl, "M" may be zirconium, "$R^1$" and "$R^2$" may be methyl groups, "x" may be 4, "y" may be 1, and the metal precursor may be tris dimethylamino cyclopentadienyl zirconium expressed by the following chemical formula 1.

[Chemical formula 1]

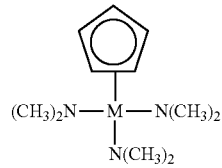

Since this metal precursor may include an aromatic cyclic compound such as a cyclopentadienyl group, a bonding force between a metal and an amide group may be strong so that the metal precursor is stable. Thus, according to example embodiments of inventive concepts, the metal precursor may have better thermal stability than a comparative metal precursor that includes only amide groups without an aromatic cyclic compound. As a result, according to example embodiments of inventive concepts, a thermal decomposition temperature of the metal precursor may be improved (and/or increased). As a result, according to example embodiments of inventive concepts, the thermal decomposition temperature of the metal precursor may be similar to a thermal decomposition temperature of a silicon precursor according to example embodiments of inventive concepts, such that a metal precursor according to example embodiments of inventive concepts may have a constant deposition rate (and/or substantially constant deposition rate) in a deposition temperature range similar to that of a silicon precursor according to example embodiments of inventive concepts.

According to example embodiments of inventive concepts, the metal precursor may be evaporated and supplied into the chamber. The supplied metal precursor may be adsorbed on a surface of the substrate 1. The metal precursor gas that is not adsorbed on the surface of the substrate 1 may be purged to the outside of the chamber. Subsequently, an oxygen-containing gas or a nitrogen-containing gas may be supplied into the chamber to react with the metal precursor adsorbed on the surface of the substrate, thereby forming a metal oxide layer or metal nitride layer corresponding to one atomic layer. The oxygen-containing gas may include at least one selected from a group consisting of oxygen ($O_2$), ozone ($O_3$), water vapor ($H_2O$), and nitrous oxide ($N_2O$). The nitrogen-containing gas may include at least one selected from a group consisting of nitrogen ($N_2$), ammonia ($NH_3$), and hydrazine ($N_2H$). Other ligands combined with the metal (e.g., zirconium) in the metal precursor may become combined with the oxygen-containing gas or the nitrogen-containing gas to be converted into gases such gas carbon dioxide, water vapor, nitrogen dioxide. These byproducts are purged to the outside of the chamber. This process may be repeated times to form the first sub-dielectric layer 3 having a first thickness T1, where "m" denotes a positive integer.

A second sub-dielectric layer 5 may be formed on the first sub-dielectric layer 3. The second sub-dielectric layer 5 may be a silicon oxide layer or a silicon nitride layer. In order to form the second sub-dielectric layer 5, a silicon precursor may be evaporated and supplied into the chamber. The supplied silicon precursor should have a constant deposition rate in the same deposition temperature range as the metal precursor, but example embodiments are not limited thereto. This is because it may be difficult to change the temperature of the deposition chamber as a process cycle is changed and because a process time may increase to lower productivity. Additionally, a distribution of elements in a finally formed dielectric layer 7 may not be uniform such that a dispersion of cells may be increased to cause errors. In order to improve the distribution of elements in the finally formed dielectric layer 7, a silicon precursor expressed by $H_zSi(NR^4R^5)_{4-z}$ may be provided in example embodiments of inventive concepts, where each of "$R^4$" and "$R^5$" is hydrogen or hydrocarbon. and "$z$" in the range of 2 to 3. Also, $R^3$ may be different from $R^1$, $R^2$, $R^4$, and $R^5$, but example embodiments of inventive concepts are not limited thereto.

In example embodiments of inventive concepts, "$z$" may be 2, "$R^4$" and "$R^5$"' may be ethyl groups, and the silicon precursor may be bis diethylamino silicon expressed by the following chemical formula 2.

[Chemical formula 2]

According to example embodiments of inventive concepts, a silicon precursor may include two or three hydrogen bonds. These suitable hydrogen bonds may properly control thermal stability of the silicon precursor such that the silicon precursor may have a thermal decomposition temperature similar to that of metal precursors according to example embodiments. Thus, according to example embodiments of inventive concepts, a silicon precursor may have a constant deposition rate (and/or substantially constant) in a deposition temperature similar to that of the metal precursor according to example embodiments of inventive concepts. In example embodiments of inventive concepts, a silicon precursor may be suitable to an atomic layer deposition method. However, example embodiments of inventive concepts are not limited thereto. For example, in example embodiments of inventive concepts, a silicon precursor may be used in an organic metal chemical vapor deposition method.

A silicon precursor gas that is not adsorbed on the surface of the substrate 1 may be purged to the outside of the chamber. Subsequently, the oxygen-containing gas or nitrogen-containing gas may be supplied into the chamber to react with the adsorbed silicon precursor, thereby forming a silicon oxide layer or silicon nitride layer corresponding to one atomic layer. Next, byproducts may be purged to the outside of the chamber. This process may be repeated n times to form the second sub-dielectric layer 5 having a second thickness T2, where "n" denotes a positive integer. The "n" may be different from the "m".

Referring to FIGS. 1 and 2, the first and second sub-dielectric layers 3 and 5 may be alternately and repeatedly formed k times to form a dielectric layer 7 having a desired thickness T3, where "k" denotes a positive integer. In other words, a sum of m times and n times is defined as a super cycle, and the super cycle may be repeatedly performed k times. Next, a thermal treatment may be performed at a temperature of about 500 degrees Celsius (° C.) or more to diffuse silicon atoms from the second sub-dielectric layer 5 into the first sub-dielectric layer 3. At this time, metal atoms in the first sub-dielectric layer 3 may also be diffused from the first sub-dielectric layer 3 into the second sub-dielectric layer 5. Thus, the dielectric layer 7 having a uniform atom distribution (and/or substantially uniform atom distribution) may be formed. The dielectric layer 7 may be formed of a metal oxide layer or a metal nitride layer doped with silicon. The metal oxide layer doped with silicon may be named as a metal silicate.

Alternatively, a conductive layer 9 may be formed on the first and second sub-dielectric layers 3 and 5 at a temperature of about 500 degrees Celsius or more without an additional thermal treatment. The conductive layer 9 may include a metal. For example, the conductive layer 9 may be a tungsten layer. The silicon atoms and the metal atoms may be diffused during the formation of the conductive layer 9.

A content of the silicon atoms with respect to a sum of the number of the metal atoms and the number of the silicon atoms in the dielectric layer 7 may be in the range of about 0.5% to about 50%.

The dielectric layer 7 may correspond to a gate insulating layer or a capacitor dielectric layer of a capacitor. The conductive layer 9 may correspond to a gate electrode or an upper electrode of the capacitor. If the dielectric layer 7 is the capacitor dielectric layer, a lower electrode may be formed before the dielectric layer 7 is formed.

As described above, the dielectric layer 7 may be formed by the atomic layer deposition method. Alternatively, the dielectric layer 7 may be formed by an organic metal chemical vapor deposition method using the metal precursor and the silicon precursor described above.

EXPERIMENTAL EXAMPLE 1

Thermal decomposition start temperatures of metal precursors and silicon precursors according to example embodiments of inventive concepts and comparative examples were checked in an experimental example. Tris dimethylamino cyclopentadienyl zirconium (TDCZ) of the chemical formula 1 was selected as the metal precursor according to example embodiments of inventive concepts, and bis diethylamino silicon (BDEAS) was selected as the silicon precursor according to example embodiments of inventive concepts. Next, $Zr(N(C_2H_5)_2)_4$, which does not include an aromatic cyclic compound was selected as the comparative example metal precursor, and $HSi(N(CH_3)_2)_3$ having one hydrogen bond, was selected as the comparative example silicon precursor. Each of the precursors were heated to obtain their thermal decomposition start temperatures. The obtained thermal decomposition start temperatures are represented in the following table 1.

TABLE 1

|  | Metal precursor | | Silicon precursor | |
| --- | --- | --- | --- | --- |
|  | $Zr(N(C_2H_5)_2)_4$ | TDCZ | $HSi(N(CH_3)_2)_3$ | BDEAS |
| Thermal decomposition start temperature (° C.) | 140 | 160 | 360 | 200 |

Referring to the table 1, the metal precursor (TDCZ) according to example embodiments of inventive concepts has the thermal decomposition start temperature of 160° C., which is higher than that of the metal precursor ($Zr(N(C_2H_5)_2)_4$). The metal precursor (TDCZ) according to example embodiments of inventive concepts may have a higher thermal decomposition start temperature because TDCZ includes the cyclopentadienyl group as the aromatic cyclic compound. Thus. the cylcopentadienyl group may improve the thermal stability of TDCZ. Thus, TDCZ may have thermal stability that is greater than that of the comparative example metal precursor.

On the other hand, according to example embodiments of inventive concepts, the silicon precursor (BDEAS) has a thermal decomposition start temperature of 200° C., which is lower than that of the comparative example silicon precursor ($HSi(N(CH_3)_2)_3$). This may be because BDEAS further has one hydrogen bond as compared with $HSi(N(CH_3)_2)_3$. According to example embodiments, the metal precursor (TDCZ) and the silicon precursor (BDEAS) may have thermal decomposition start temperatures that are more similar to each other compared to the comparative examples. As a result, deposition processes using a metal precursor and a silicon precursor according to example embodiments of inventive concepts. such as TDCZ and BDEAS. may be performed more easily in one process chamber at temperatures in similar temperature ranges to each other.

EXPERIMENTAL EXAMPLE 2

Deposition rates according to a temperature of metal and silicon precursors according to example embodiments of inventive concepts were examined. The examined deposition rates are represented in FIG. 3, where the metal precursor and silicon precursor of the inventive concepts are the same TDCZ and BDEAS discussed above in experimental example 1.

Figure 3:
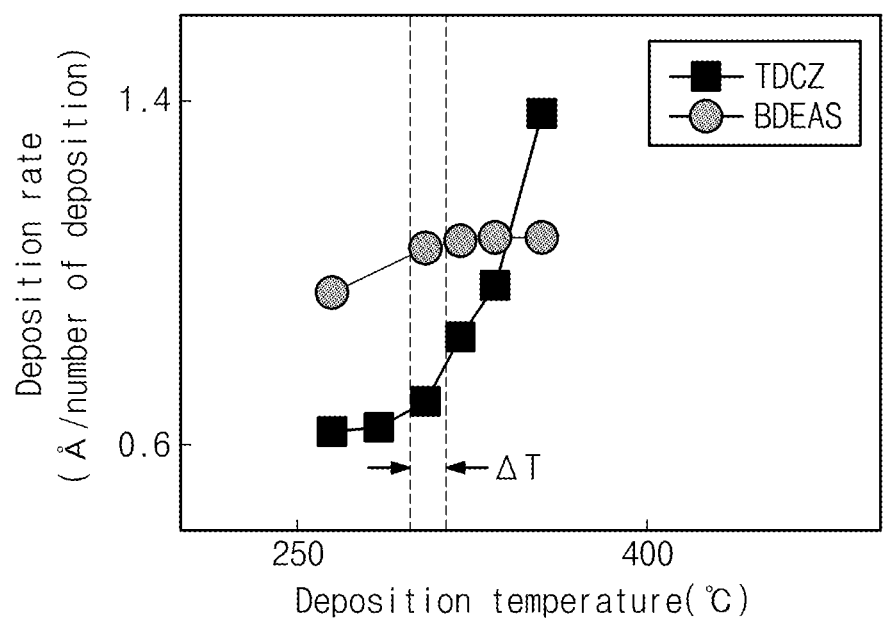
FIG. 3 is a graph illustrating the results of an experimental example 2 according to example embodiments of inventive concepts.

Referring to FIG. 3, the deposition rates of all of the two precursors were varied in the range of about 250° C. to about 400° C. Additionally, the two precursors had substantially constant deposition rates in a specific temperature range ΔT within the range of about 250° C. to about 400° C. Thus, if the deposition processes are performed using the two precursors at a temperature in the specific temperature range ΔT, the distribution of the metal atoms and the silicon atoms may be uniform in the dielectric layer. The dielectric layer having the uniform distribution of the metal and silicon atoms may have improved leakage current characteristics.

As described above, dielectric layer may be formed using a silicon precursor and a metal precursor according to example embodiments of inventive concepts such that the characteristics of the dielectric layer may be improved. The dielectric layer may be used as the gate insulating layer or the capacitor dielectric layer to improve operating characteristics and reliability of semiconductor devices including the dielectric layer.

Semiconductor devices according to example embodiments of inventive concepts may be encapsulated using various packaging techniques. For example, semiconductor devices according to example embodiments of inventive concepts may be encapsulated using any one of a package on package (POP) technique, a ball grid arrays (BGAs) technique. a chip scale packages (CSPs) technique, a plastic leaded chip carrier (PLCC) technique. a plastic dual in-line package (PDIP) technique, a die in waffle pack technique, a die in wafer form technique, a chip on board (COB) technique. a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which semiconductor devices according to example embodiments of inventive concepts is mounted may further include a controller and/or a logic device that controls the semiconductor memory device.

Figure 4:
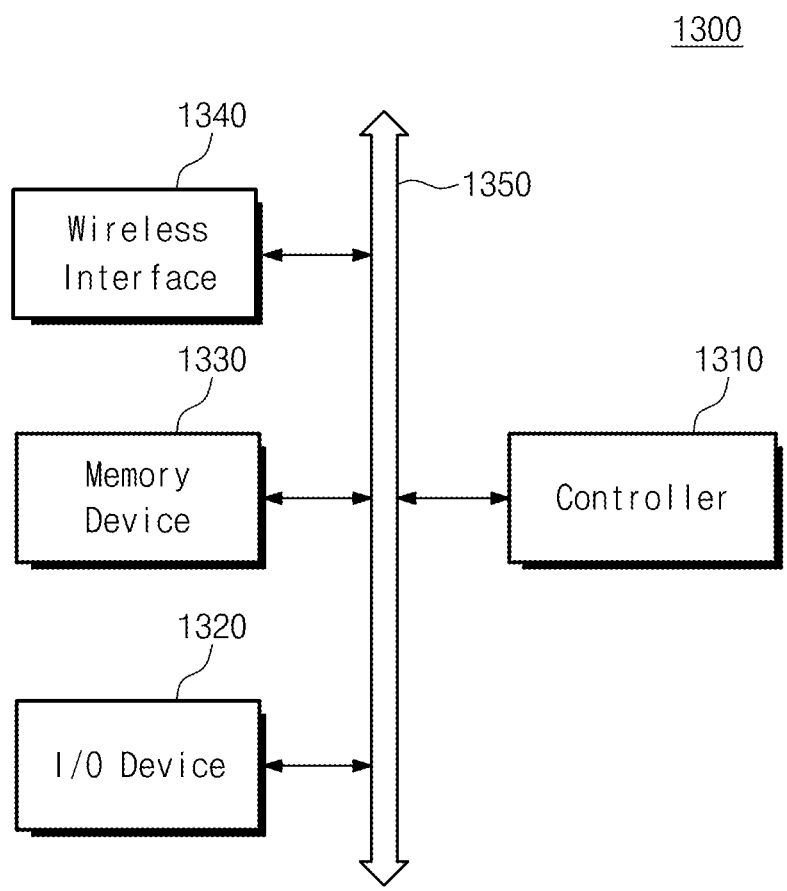
FIG. 4 is a schematic block diagram illustrating an electronic device including a semiconductor device according to example embodiments of inventive concepts.

FIG. 4 is a schematic block diagram illustrating an electronic device including a semiconductor device according to example embodiments of inventive concepts.

Referring to FIG. 4, an electronic device 1300 according to example embodiments of inventive concepts may be one of a personal digital assistant (PDA), a laptop computer, a portable computer, a web tablet, a wireless phone, a mobile phone, a digital music player, a cable/wireless electronic device. and any complex electronic device including at least two thereof. The electronic device 1300 may include a controller 1310, an input/output (I/O) device 1320 (e.g., a keypad, a keyboard and/or a display). a memory device 1330, and a wireless interface unit 1340 which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. Additionally, the memory device 1330 may also be used for storing a user data. The memory device 1330 may include a semiconductor device according to example embodiments of inventive concepts. The electronic device 1300 may use the wireless interface unit 1340 in order to transmit data to a wireless communication network communicating with a radio frequency (RF) signal or in order to receive data from the network. For example, the wireless interface unit 1340 may include an antenna or a wireless transceiver. The electronic device 1300 may be used in a communication interface protocol such as a third generation communication system (e.g., CDMA, GSM, NADC, E-TDMA, WCDAM, and/or CDMA2000).

Figure 5:
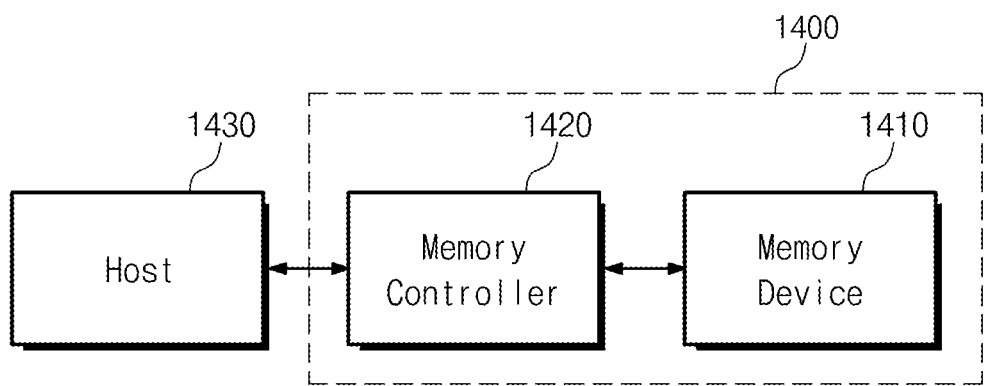
FIG. 5 is a schematic block diagram illustrating a memory system including a semiconductor device according to example embodiments of inventive concepts.

FIG. 5 is a schematic block diagram illustrating a memory system including a semiconductor device according to example embodiments of inventive concepts.

Referring to FIG. 5. semiconductor devices according to example embodiments of inventive concepts may be in a memory system. According to example embodiments of inventive concepts, a memory system 1400 may include a memory device 1410 for storing massive data and a memory controller 1420. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include the semiconductor device according to the above embodiments of the inventive concepts.

According to example embodiments of inventive concepts, at least one silicon precursor and at least one metal precursor may have substantially constant deposition rates in the same temperature range or similar temperature ranges to each other. The dielectric layer formed using the characteristics of silicon and metal precursors according to example embodiments of inventive concepts may improve the leakage current characteristics. The dielectric layer may be applied to the capacitor dielectric layer to improve the capacitance of the capacitor. Additionally, a dispersion of a silicon concentration of the insulating layer may be reduced to improve the cell dispersion.

While some example embodiments have been particularly shown and described, it will be understood by one of ordinary skill in the art that variations in form and detail may be made therein without departing from the spirit and scope of the claims.

What is claimed is:

1. A method of forming a layer, the method comprising:
forming a dielectric layer using a metal precursor expressed by one of $R^3_y M(NR^1R^2)_{x-y}$ and $M(OR^1R^2)$ and using a silicon precursor expressed by $H_z Si(NR^4R^5)_{4-z}$,
each of $R^1$, $R^2$, $R^3$, $R^4$, and $R^5$ being hydrogen or hydrocarbon;
$R^3$ being different than $R^1$ and $R^2$,
x being in the range of 3 to 5,
y being in the range of 1 to 4,
z being in the range of 2 to 3,
M being a metal, and
the dielectric layer being one of a metal silicate layer and a metal nitride layer doped with silicon;
wherein forming the dielectric layer comprises:
repeating forming a first sub-dielectric layer and forming a second sub-dielectric layer,
the forming the first sub-dielectric layer includes forming m atomic layers, each one of the m atomic layers including one of a metal oxide layer and a metal nitride layer,
the forming of the second sub-dielectric layer includes forming n atomic layers, each one of the n atomic layers including one of a silicon oxide layer and a silicon nitride layer, and
m and n are positive integers, respectively.

2. The method of claim 1, wherein $R^3$ is an aromatic cyclic compound.

3. The method of claim 1, wherein $R^3$ is $R^6(C_5H_5)$, where $R^6$ is an alkyl having 1 to 4 carbon(s).

4. The method of claim 1, wherein M is one element from groups III, IV and V metals including lanthanide.

5. The method of claim 1, wherein
$R^3$ is cyclopentadienyl, M is zirconium, $R^1$ and $R^2$ are methyl groups; and
the metal precursor is expressed by the following chemical formula 1:

[Chemical formula 1]

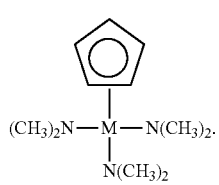

6. The method of claim 1, wherein
z is 2,
$R^4$ and $R^5$ are ethyl groups, and
the silicon precursor is expressed by the following chemical formula 2:

[Chemical formula 2]

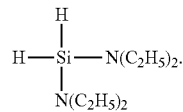

7. The method of claim 1, wherein
the forming m atomic layers comprises repeating m times,
supplying the metal precursor to the substrate to adsorb the metal precursor on a surface of the substrate, and
supplying one of an oxygen-containing gas and a nitrogen-containing gas to react the metal precursor with the one of oxygen-containing gas and the nitrogen-containing gas, thereby forming one atomic layer of the first sub-dielectric layer; and
the forming n atomic layers comprises repeating n times,
supplying the silicon precursor to the substrate to absorb the silicon precursor on the surface of the substrate, and
supplying one of the nitrogen-containing gas and oxygen-containing gas to react the silicon precursor with the one of the nitrogen-containing gas and oxygen-containing gas, thereby forming one atomic layer of the second sub-dielectric layer.

8. The method of claim 7, wherein m and n are different values.

9. The method of claim 7, further comprising:
performing a thermal treatment, wherein
the thermal treatment diffuses silicon atoms form the second sub-dielectric layer into the first sub-dielectric layer.

10. The method of claim 9, wherein the thermal treatment is performed at a temperature of at least about 500 degrees Celsius (° C.).

11. The method of claim 7, wherein,
the repeating forming a first sub-dielectric layer and forming a second sub-dielectric layer forms a plurality of first sub-dielectric layers and second sub-dielectric layers alternately stacked on each other, and the method further includes:
depositing a metal layer on the alternately stacked first and second sub-dielectric layers, wherein
the depositing the metal layer is performed at a temperature of about 500 degrees Celsius (° C.) or more, and
silicon atoms included in the second sub-dielectric layer are diffused into the first sub-dielectric layer during the depositing the metal layer.

12. The method of claim 7, wherein
the oxygen-containing gas includes at least one of oxygen ($O_2$), ozone ($O_3$), water vapor ($H_2O$), and nitrous oxide ($N_2O$); and
the nitrogen-containing gas includes at least one of nitrogen ($N_2$), ammonia ($NH_3$), and hydrazine ($N_2H_4$).

13. The method of claim 1, wherein forming the dielectric layer includes one of an atomic layer deposition method and an organic metal chemical vapor deposition method.

14. The method of claim 1, wherein the silicon precursor and the metal precursor respectively have substantially constant deposition rates in about a same temperature range.

15. The method of claim 1, wherein forming the dielectric layer includes forming one of a gate insulating layer and a capacitor dielectric layer.

16. A method of forming a layer, the method comprising:
depositing a metal precursor on a substrate,
the metal precursor expressed by one of $R^3_y M(NR^1R^2)_{x-y}$ and $M(OR^1R^2)$, each of $R^1$, $R^2$, and $R^3$ is one of hydrogen and hydrocarbon,
$R^3$ is different than $R^1$ and $R^2$,
x is in the range of 3 to 5,
y is in the range of 1 to 4, and
M is one element from groups III, IV, and V including lanthanide;
depositing a silicon precursor on the substrate,
the silicon precursor expressed by $H_zSi(NR^4R^5)_{4-z}$,
each of $R^4$ and $R^5$ is one of hydrogen and hydrocarbon,
z is in the range of 2 to 3; and
forming a dielectric layer using the metal precursor and the silicon precursor by:
repeating forming a first sub-dielectric layer and forming a second sub-dielectric layer,
the forming the first sub-dielectric layer including forming m atomic layers, each one of the m atomic layers including one of a metal oxide layer and a metal nitride layer,
the forming of the second sub-dielectric layer including forming n atomic layers, each one of the n atomic layers including one of a silicon oxide layer and a silicon nitride layer, and
m and n are positive integers, respectively.

17. The method of claim 16, wherein
the depositing the metal precursor on the substrate and the depositing the silicon precursor on the substrate are performed in one process chamber at temperatures in similar temperature ranges to each other.

18. The method of claim 16, wherein:
the forming m atomic layers comprises repeating m times,
depositing an amount of the metal precursor on the substrate in a process chamber,
purging a portion of the metal precursor that is not adsorbed on the substrate to an outside of the chamber, and
forming one layer of the first sub-dielectric layer by reacting one of a oxygen-containing gas and a nitrogen-containing gas with an adsorbed portion of the metal precursor that is adsorbed on the substrate;
the forming n atomic layer comprises repeating n times,
supplying an amount of the silicon precursor on the substrate in the process chamber,
purging a portion of the silicon precursor that is not adsorbed to the substrate to the outside of the chamber, and
forming one layer of the second sub-dielectric layer by reacting one of the nitrogen-containing gas and the oxygen-containing gas with an adsorbed portion of the silicon precursor that is adsorbed on the substrate;
wherein a plurality of first and second sub-dielectric layers are alternately stacked;
one of a thermal treatment and a conductive layer deposition process is performed on the substrate after the forming the plurality of first and second sub-dielectric layers alternately stacked, and
m and n are positive integers.

19. The method of claim 16, wherein
the metal precursor and the silicon precursor are expressed by the following chemical formulae 1 and 2, respectively:

[Chemical formula 1]

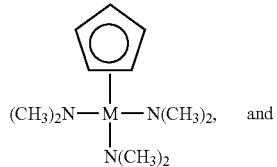

and

[Chemical formula 2]

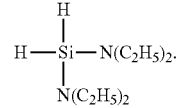

* * * * *